United States Patent
Park

(10) Patent No.: US 7,499,348 B2
(45) Date of Patent: Mar. 3, 2009

(54) APPARATUS FOR SENSING DATA OF SEMICONDUCTOR INTEGRATED CIRCUIT

(75) Inventor: Sang-Il Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/647,466

(22) Filed: Dec. 29, 2006

(65) Prior Publication Data

US 2007/0183237 A1    Aug. 9, 2007

(30) Foreign Application Priority Data

Feb. 9, 2006    (KR) ...................... 10-2006-0012350

(51) Int. Cl.
*G11C 7/00* (2006.01)
(52) U.S. Cl. ........................ 365/194; 365/207; 327/530
(58) Field of Classification Search ............ 365/230.03, 365/194, 207; 327/512, 530
See application file for complete search history.

(56) References Cited

U.S. PATENT DOCUMENTS

| | | | | |
|---|---|---|---|---|
| 4,477,736 A * | 10/1984 | Onishi | ......................... | 327/543 |
| 4,551,641 A * | 11/1985 | Pelley, III | ..................... | 365/205 |
| 4,873,458 A * | 10/1989 | Yoshida | ....................... | 327/83 |
| 5,008,609 A * | 4/1991 | Fukiage | ....................... | 323/313 |
| 5,220,221 A * | 6/1993 | Casper | ......................... | 327/51 |
| 5,631,547 A * | 5/1997 | Fujioka et al. | .............. | 323/273 |
| 5,638,333 A * | 6/1997 | Lee | ............................ | 365/205 |
| 5,764,178 A * | 6/1998 | Kim | ............................ | 341/173 |
| 6,009,030 A * | 12/1999 | Seo | ............................ | 365/205 |
| 6,075,736 A | 6/2000 | Kim et al. | | |
| 6,181,640 B1 * | 1/2001 | Kang | ........................... | 365/203 |
| 6,201,433 B1 * | 3/2001 | Nagatomo | ................... | 327/530 |
| 6,333,869 B1 * | 12/2001 | Tanizaki et al. | .............. | 365/63 |
| 6,414,521 B1 * | 7/2002 | Potter et al. | .................... | 327/67 |
| 6,777,978 B2 * | 8/2004 | Hart et al. | ..................... | 326/38 |
| 6,831,853 B2 * | 12/2004 | Lin et al. | .................... | 365/154 |
| 6,996,019 B2 | 2/2006 | Song | | |
| 7,002,862 B2 | 2/2006 | Kang | | |

(Continued)

FOREIGN PATENT DOCUMENTS

JP    2001168302    6/2001

(Continued)

*Primary Examiner*—Hoai V Ho
*Assistant Examiner*—Jay Radke
(74) *Attorney, Agent, or Firm*—Venable LLP; Jeffri A. Kaminski

(57) ABSTRACT

An apparatus includes a plurality of first driving signal driving units, and generates a first driving signal by driving an input signal, a plurality of second driving signal driving units, each of which drives an input signal and generates a second driving signal, a timing control unit that controls each of the first driving signal driving units such that a predetermined time difference is generated between an enable timing of the first driving signal and an enable timing of the second driving signal, a plurality of sense amplifier driving units, each of which generates a first driving level and a second driving level according to the first driving signal and the second driving signal, and a plurality of sense amplifiers that are provided for respective bit line pairs, and each include first type switching elements operating according to the first driving level and second type switching elements operating according to the second driving level.

14 Claims, 9 Drawing Sheets

U.S. PATENT DOCUMENTS

| | | |
|---|---|---|
| 7,095,665 B2 | 8/2006 | Song |
| 2003/0128608 A1 | 7/2003 | Song et al. |
| 2004/0075104 A1* | 4/2004 | Hara et al. .................. 257/159 |
| 2004/0095800 A1* | 5/2004 | Lin et al. .................... 365/154 |
| 2005/0122812 A1 | 6/2005 | Song |

FOREIGN PATENT DOCUMENTS

| | | |
|---|---|---|
| JP | 2003218239 | 7/2003 |
| JP | 2005149717 | 6/2005 |
| KR | 1019970067358 | 10/1997 |
| KR | 1020030026009 A | 3/2003 |
| KR | 1020050052716 A | 6/2005 |
| KR | 1020060069946 A | 6/2006 |

* cited by examiner

[Normal VDD]

[High VDD]

[Normal VDD]

[High VDD]

APPARATUS FOR SENSING DATA OF SEMICONDUCTOR INTEGRATED CIRCUIT

BACKGROUND OF THE INVENTION

1. Technical Field

The present invention relates to a semiconductor integrated circuit, and more particularly, to an apparatus for sensing data of a semiconductor integrated circuit.

2. Related Art

Among semiconductor integrated circuits, DRAM (Dynamic Random Access Memory) devices sense and amplify data, which is stored in memory cells, using sense amplifiers. The sense amplifiers are connected to bit lines of the memory cells respectively, and determine memory cell data by comparing a voltage level at which a charge is shared between the bit lines and a precharge voltage level of a bit line. A sense amplifier block may be connected to one memory block and sense data stored in memory cells within the memory block. The sense amplifier block may also be connected to two memory blocks and selectively sense data stored in memory cells within one of the two memory blocks.

A conventional apparatus for sensing data of a semiconductor integrated circuit includes sense amplifiers. Each of the sense amplifiers includes first and second CMOS inverters that are connected to each other with a latch structure.

There may be a difference between a threshold voltage of the MOS transistor in the first CMOS inverter and a threshold voltage of the MOS transistor in the second CMOS inverter may be. More specifically, as an integration density of the semiconductor integrated circuits increases, channel lengths of the MOS transistors may be slightly changed during a process of manufacturing the MOS transistors. This small change in the channel lengths may cause the difference in threshold voltage between the MOS transistors.

FIG. 1 is a graph illustrating simulation results of threshold voltage offset between right CMOS transistors and between left CMOS transistors (that is, NMOS transistors and PMOS transistors) that constitute a sense amplifier according to the related art. As shown in FIG. 1, the difference in threshold voltage offset between the PMOS transistors is larger than the difference in threshold voltage offset between the NMOS transistors.

The difference in threshold voltage between the PMOS transistors causes a difference in sense amplifier driving signals for driving the sense amplifier. That is, each of the PMOS transistors comprising the sense amplifier has a drain to which an RTO signal is input, and each of the NMOS transistors comprising the sense amplifier has a source to which an SB signal is input. The amount of time required for the RTO signal to become a VDD level is shorter than the amount of time required for the SB signal to become a VSS level, due to the variation of the PMOS transistor. Therefore, even when the NMOS transistors need to be turned on, the PMOS transistors are turned on first, which causes an error in the sense amplifier.

According to another method of the related art, referring to FIGS. 2A and 2B, the technique has been proposed, in which a signal for driving NMOS transistors (for example, SAN) of a CMOS latch is generated, and then, a signal for driving PMOS transistors (for example, SAP) is generated. Therefore, in theory, it is designed so that the NMOS transistors configuring the CMOS latch are turned on earlier than the PMOS transistors.

However, when the semiconductor integrated circuit operates at a high VDD condition, a time difference between the signal for driving the NMOS transistors and the signal for driving the PMOS transistors is reduced. Therefore, in fact, the PMOS transistors are still turned on first, which causes a sensing error.

SUMMARY OF THE INVENTION

Embodiments of the present invention provide an apparatus for sensing data of a semiconductor memory that is capable of preventing a data sensing error.

According to an embodiment of the invention, there is provided an apparatus for sensing data of a semiconductor memory that includes: a plurality of first driving signal driving units, each of which includes a first inverter and a second inverter receiving an output of the-first inverter, and generates a first driving signal by driving an input signal; a plurality of second driving signal driving units, each of which drives an input signal and generates a second driving signal; a timing control unit that controls each of the first driving signal driving units such that a predetermined time difference is generated between an enable timing of the first driving signal and an enable timing of the second driving signal; a plurality of sense amplifier driving units, each of which generates a first driving level and a second driving level according to the first driving signal and the second driving signal; and a plurality of sense amplifiers that are provided for respective bit line pairs, each having a bit line and a bit bar line, and each including first type switching elements operating according to the first driving level and second type switching elements operating according to the second driving level.

BRIEF DESCRIPTION OF THE DRAWINGS

The above and other features and advantages of the present invention will become more apparent by describing in detail exemplary embodiments thereof with reference to the attached drawings in which.

DESCRIPTION OF EXEMPLARY EMBODIMENTS

Figure 1:
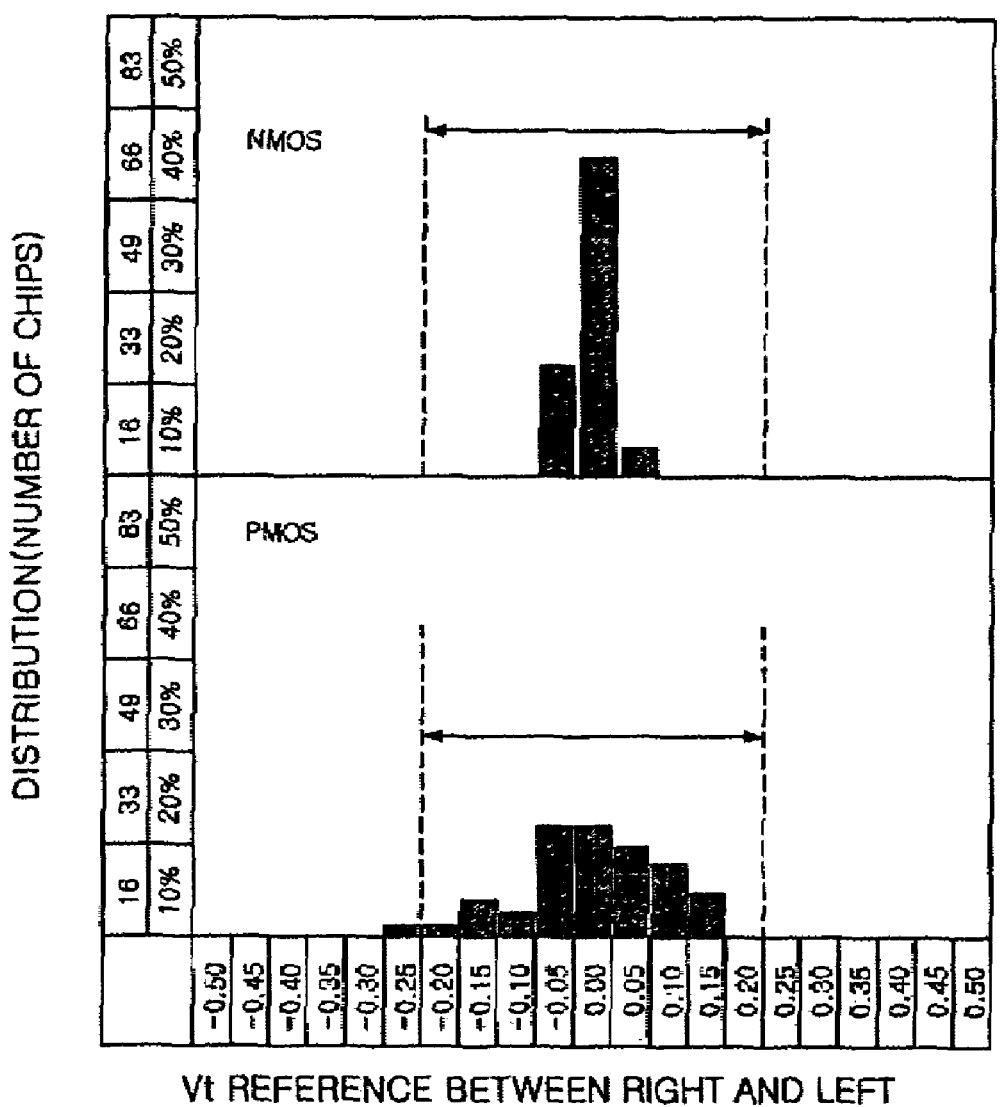
FIG. 1 is a graph illustrating offset voltage characteristics of internal transistors constituting a general sense amplifier.
Figure 2A:
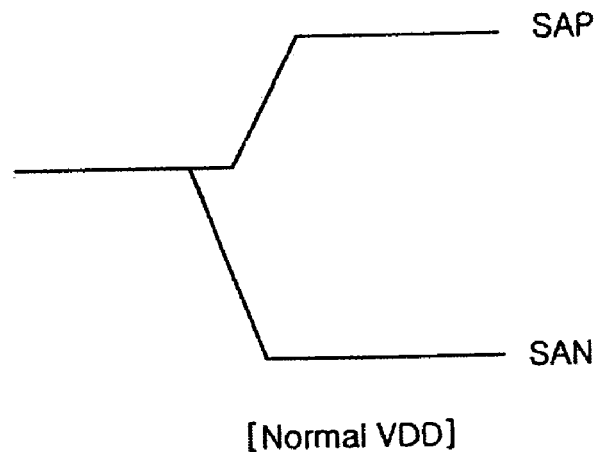
FIGS. 2A and 2B are waveform diagrams illustrating an operation of a sense amplifier at a high VDD condition according to the related art.
Figure 2B:
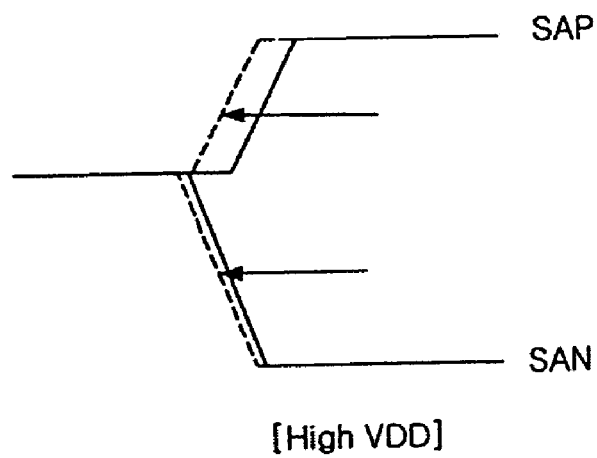

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

Figure 3:
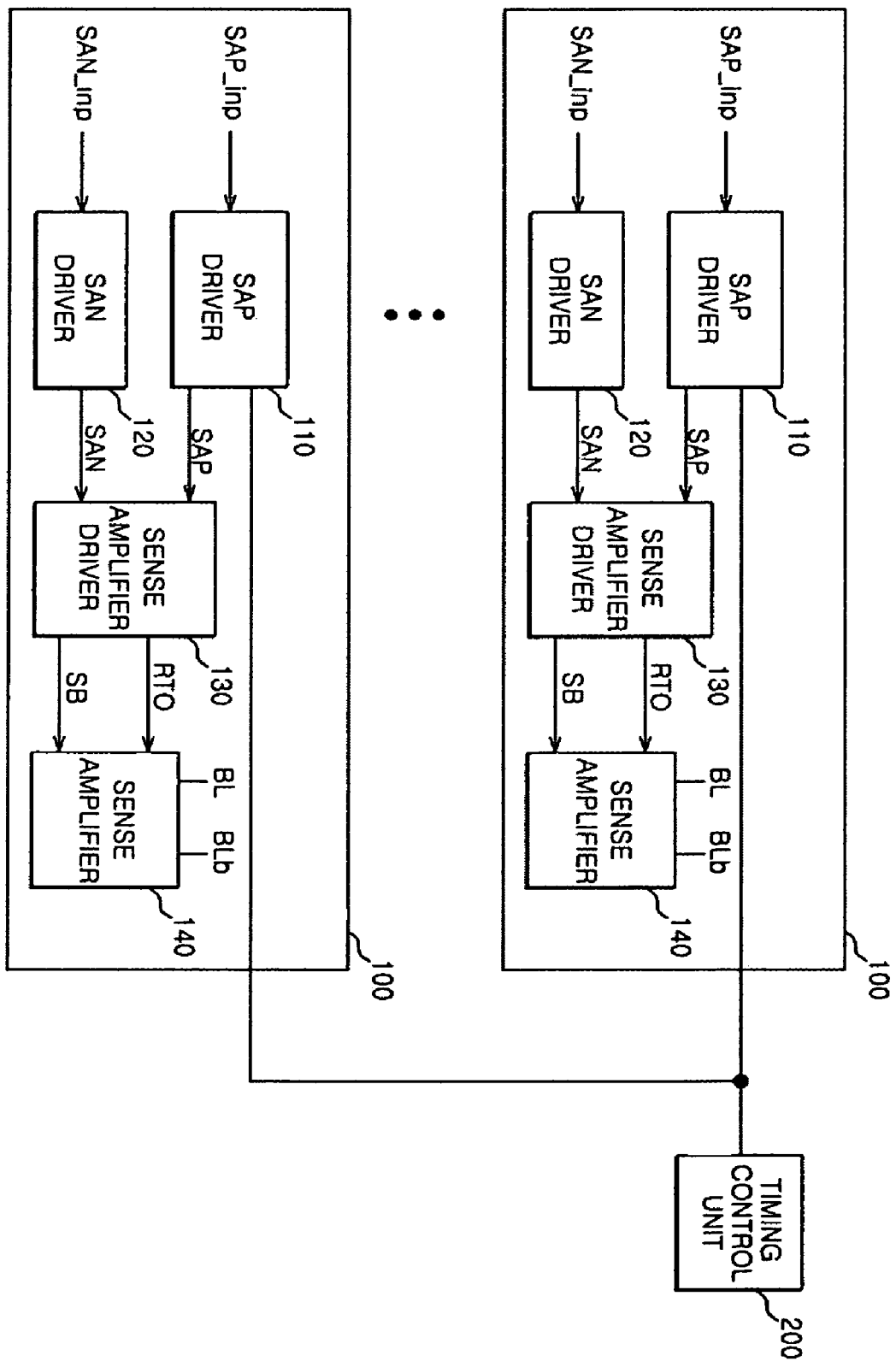
FIG. 3 is a block diagram illustrating a structure of an apparatus for sensing data of a semiconductor memory according to an embodiment of the invention.

Referring to FIG. 3, an apparatus for sensing data of a semiconductor integrated circuit according to an embodiment of the present invention includes a plurality of data sensing units 100 provided for respective bit line pairs, each of which includes a bit line BL and a bit bar line BLb, and a timing control unit 200.

Each of the data sensing units 100 includes an SAP driver 110, an SAN driver 120, a sense amplifier driver 130, and a sense amplifier 140.

The SAP driver 110 drives a first input signal SAP_inp thereby generating a first driving signal SAP. A structure of the SAP driver 110 will be described in detail below.

Figure 4:
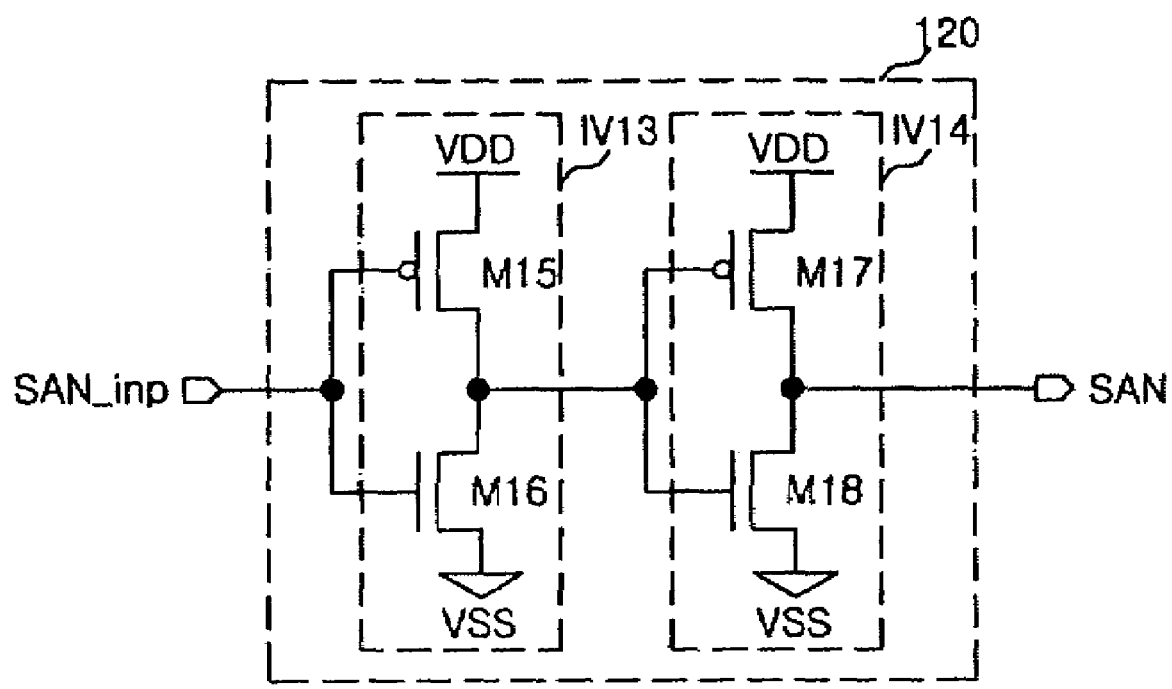
FIG. 4 is an internal circuit diagram of an SAN driver of FIG. 3.

Referring to FIG. 4, the SAN driver 120 drives a second input signal SAN_inp thereby generating a second driving signal SAN. The SAN driver 120 includes a third inverter IV13 that has fifth and sixth transistors M15 and M16, and a fourth inverter IV14 that has seventh and eight transistors M17 and M18. The second input signal SAN_inp becomes an input signal to the third inverter IV13, and an output signal of the third inverter IV13 becomes an input signal to the fourth inverter IV14.

Figure 5:
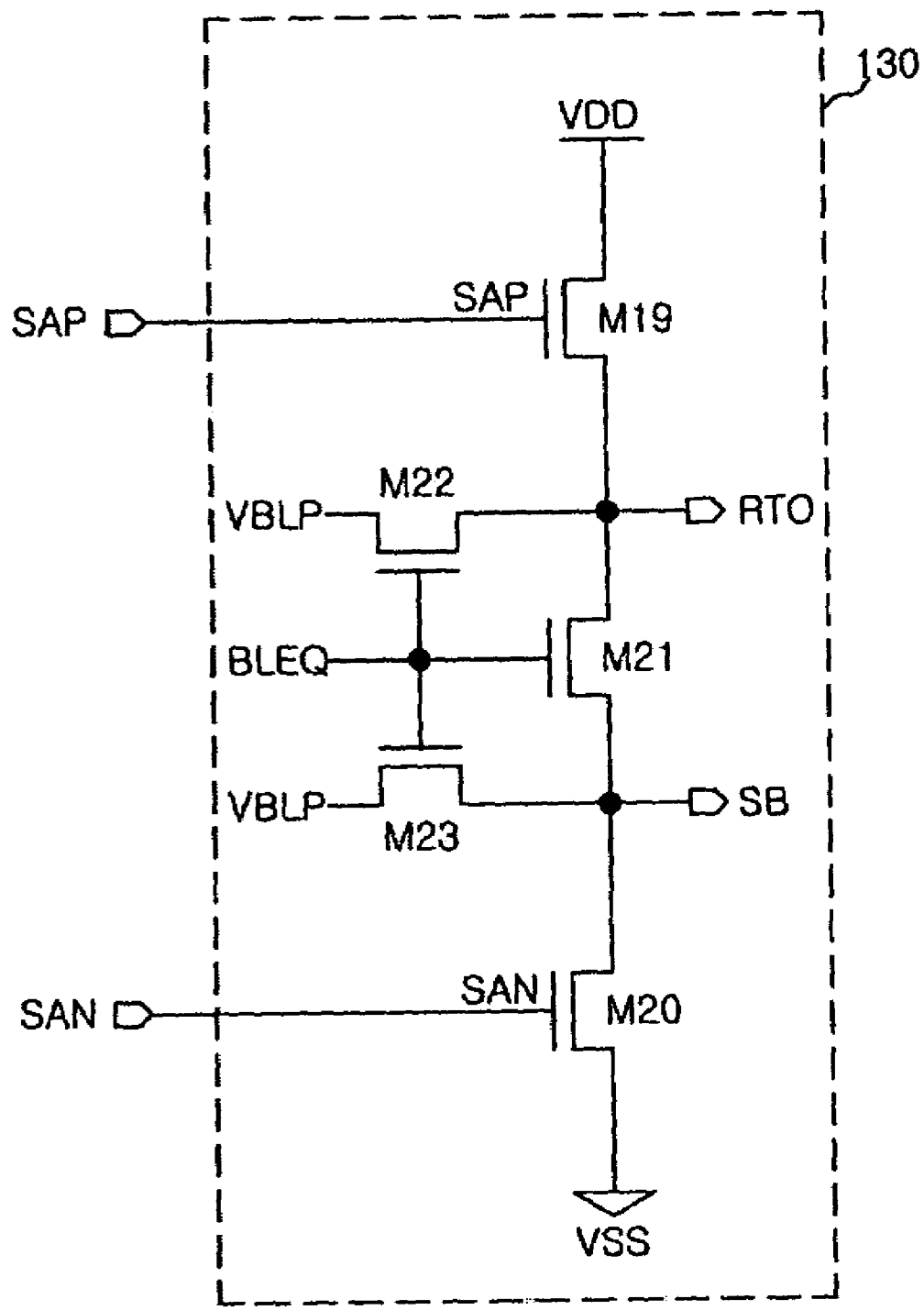
FIG. 5 is an internal circuit diagram of a sense amplifier driver of FIG. 3.

Referring to FIG. 5, the sense amplifier driver 130 generates a first driving level RTO and a second driving level SB according to the first and second driving signals SAP and SAN, respectively. The sense amplifier driver 130 includes ninth through thirteenth transistors M19, M20, M21, M22, and M23. The ninth transistor M19 has a gate to which the SAP signal is input, and a drain to which a power supply voltage VDD is applied. The tenth transistor M20 has a gate to which the SAN signal is input, and a source to which a ground voltage VSS is applied. The eleventh transistor M21 is connected between a source of the ninth transistor M19 and a drain of the tenth transistor M20, and responds to a bit line equalizing signal BLEQ. Each of the twelfth and thirteenth transistors M22 and M23 has a gate, to which the bit line equalizing signal BLEQ and a drain, to which a bit line precharge voltage VBLP is applied. A source of the twelfth transistor M22 is connected to a connection node between the ninth transistor M19 and the eleventh transistor M21. A source of the thirteenth transistor M23 is connected to a connection node between the eleventh transistor M21 and the tenth transistor M20. The respective connection nodes become levels of sense amplifier enable signals, that is, sense amplifier driving levels RT0 and SB.

Figure 6:
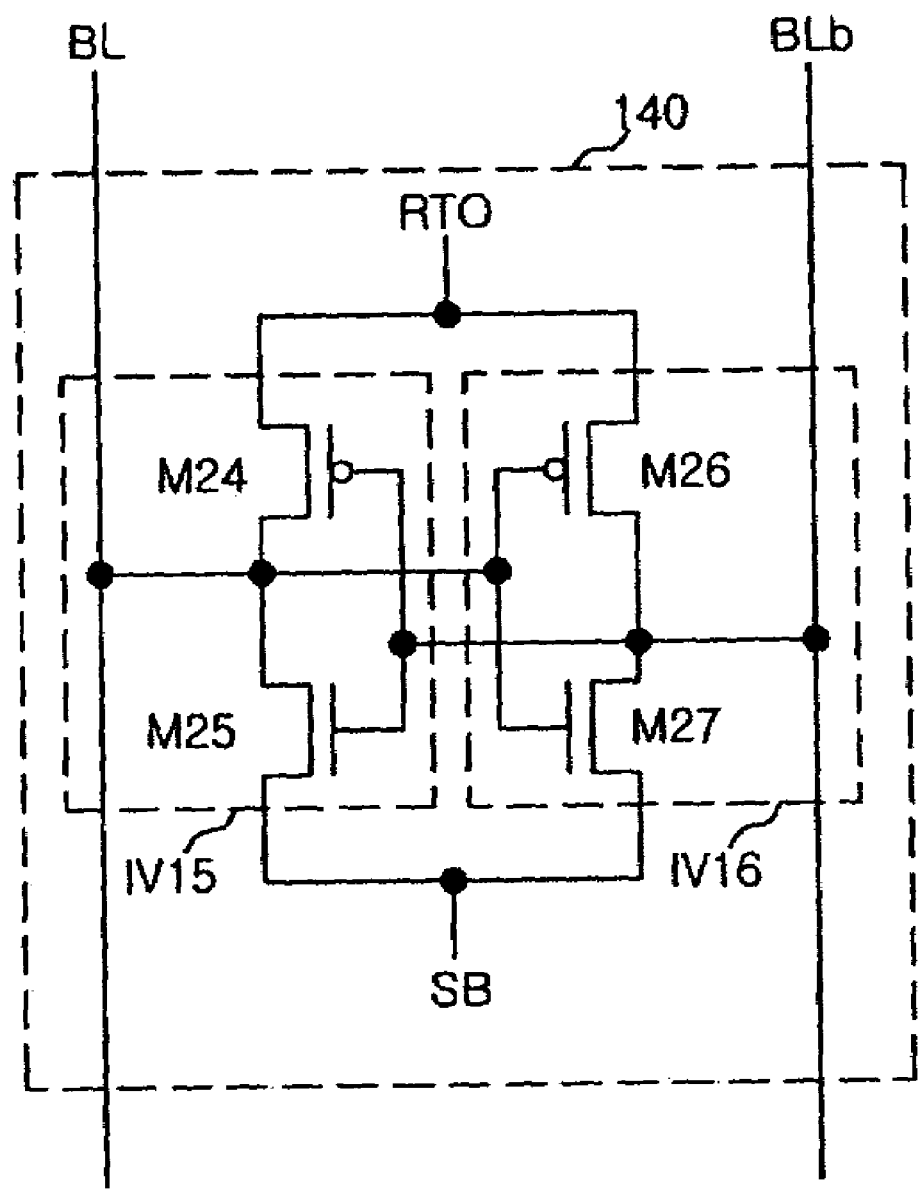
FIG. 6 is an internal circuit diagram of a sense amplifier driver of FIG. 3.

As shown in FIG. 6, the sense amplifier 140 senses cell data of the bit line BL and bit bar line BLb according to the first and second driving levels RT0 and SB. The sense amplifier 140 includes a fifth inverter IV15 that has fourteenth and fifteenth transistors M24 and M25, and a sixth inverter IV16 that has sixteenth and seventeenth transistors M26 and M27. The fifth inverter IV15 is connected with the sixth inverter IV15 to form a latch structure. That is, output signals of the fifth inverter IV15 and the sixth inverter IV16 become outputs of the sixth inverter IV16 and the fifth inverter IV15, respectively. The bit line BL is connected to an input terminal of the sixth inverter IV16, and the bit bar line BLb is connected to an input terminal of the fifth inverter IV15. The data sensing units 100 may have the same structure.

Meanwhile, the timing control unit 200 controls the SAP drivers 110 of the plurality of data sensing units 100, such that a predetermined time difference exists between an enable timing of the first driving signal SAP and an enable timing of the second driving signal SAN. A structure of the timing control unit 200 and a connection structure between the timing control unit 200 and the SAP drivers 110 will be described with reference to FIG. 7.

Figure 7:
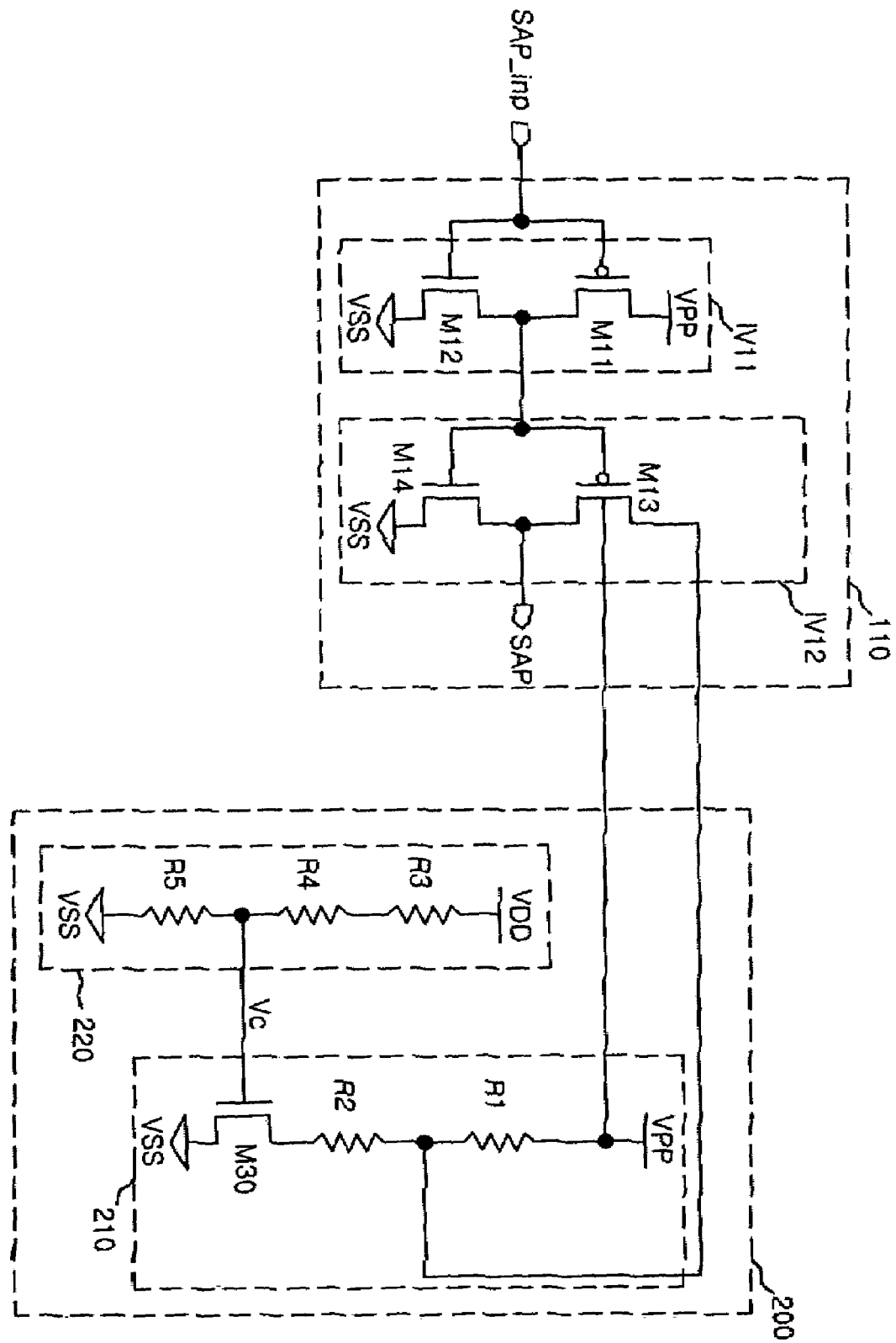
FIG. 7 is an internal circuit diagram illustrating the connection relationship between an SAP driver and a timing control unit according to an embodiment of the invention.

Referring to FIG. 7, the SAP driver 110 includes a first inverter IV11 that has first and second transistors M11 and M12, and a second inverter IV12 that has third and fourth transistors M13 and M14. The first input signal SAP_inp is input to an input terminal of the first inverter IV11, and an output signal of the first inverter IV11 becomes an input signal to the second inverter IV12.

The timing control unit 200 includes an output delay unit 210 and a delay time control unit 220.

The output delay unit 210 delays an output timing of the SAP according to a delay time adjusting signal Vc. The output delay unit 210 includes a first resistor R1 and a second resistor R2, and a transistor M30 that controls the amount of power supply current that flows through the first and second resistors R1 and R2 according to the delay time adjusting signal Vc. The first and the second resister R1 and R2 divide a power supply voltage VPP. One end of the first resistor R1 is connected to a power supply terminal VPP, and a bulk of the PMOS transistor M13 of the second inverter IV12 of the SAP driver 110 is also connected to the power supply terminal VPP. The second resistor R2 is connected between the first resistor R1 and the power supply current adjusting transistor M30, and a connection node between the first resistor R1 and the second resistor R2 is connected to a source of the PMOS transistor M13 of the second inverter IV12 of the SAP driver 110.

The transistor M30 has a drain connected to the other end of the second resistor R2, a source connected to a ground terminal VSS, and a gate receiving the delay time adjusting signal Vc.

The delay time adjusting unit 220 outputs the delay time adjusting signal Vc according to a level of an external power supply VDD. The delay time adjusting unit 220 includes third to fifth resistors R3 through R5 connected in series between an external power supply terminal VDD and a ground terminal VSS. The third to fifth resistors R3 through R5 divide the external power supply VDD to generate the delay time adjusting signal Vc.

The operation of the apparatus for sensing data of the semiconductor integrated circuit that has the above-described structure according to an embodiment of the present invention will be described below.

First, an operational principle of an embodiment of the present invention is that the SB, which is the second driving level of the sense amplifier 140, reaches a ground level VSS before the RT0, which is the first driving level thereof. That is, the enable timing of the SAP, which is the first driving signal generating the RTO, needs to be later than that of the SAN, which is the second driving signal. In other words, the SAP is enabled later than the SAN with a sufficient time difference therebetween.

Therefore, in this embodiment of the present invention, the output of the PMOS transistor M13 of the SAP driver 110 generating the SAP is delayed such that the SAP is delayed more than the SAN. The operation of an embodiment of the present invention will be described according to the above-described principle.

As shown in FIG. 7, the source of transistor M13 in the SAP driver 110 is electrically separated from the bulk of the transistor M13 of the SAP driver 110. Here, the bulk of the transistor is a well region(not show) where the transistor is formed. That is, the internal power supply VPP that has a level higher than the external power supply VDD is connected to a bulk terminal of the transistor M13, and the internal power supply VPP generating a voltage-dropping by the output delaying unit 210 is connected to the source of the transistor M13.

When a level of the external power supply VDD increases, a level of the delay time adjusting signal Vc that is output from the delay time adjusting unit 220 increases. Therefore, on resistance of the transistor M30 is reduced. Accordingly, the current according to the internal power supply VPP increases, and a level of the internal power supply VPP applied to the source of the transistor M13 drops due to the resistor R1.

As the level of the external power supply VDD increases, the level of the source of the transistor M13 decreases. Therefore, a threshold voltage VT of the third transistor M13 increases by a difference between the voltage level of the source of the transistor M13 and a voltage level of the bulk terminal thereof.

As the threshold voltage VT of the transistor M13 increases, output of the SAP of the SAP driver 110 is delayed. The delay time increases in proportion to the level of the external power supply VDD.

When the level of the external power supply VDD increases, the output of the transistor M13 becomes quicker. That is, when the level of the external power supply VDD increases, the transistor M13 is turned on quicker. Therefore, as the delay time increases according to the level of the external power supply VDD, the time between the outputting time of SAP and the outputting time of SAN allow for sensing the data stably.

Figure 8A:
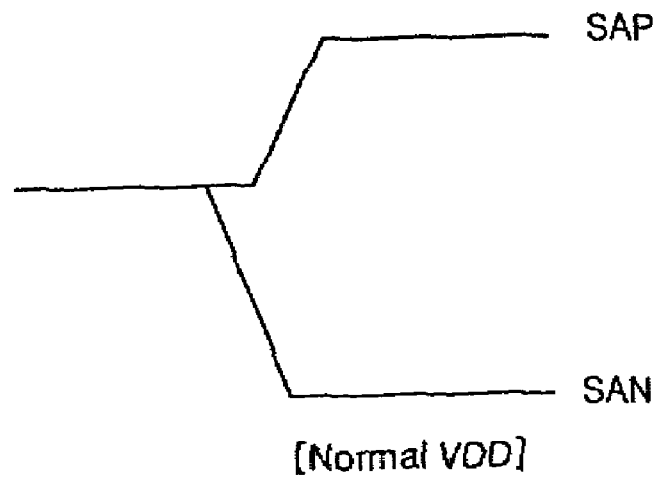
FIGS. 8A and 8B are waveform diagrams illustrating an operation of a sense amplifier at a high VDD condition according to an embodiment of the invention.
Figure 8B:
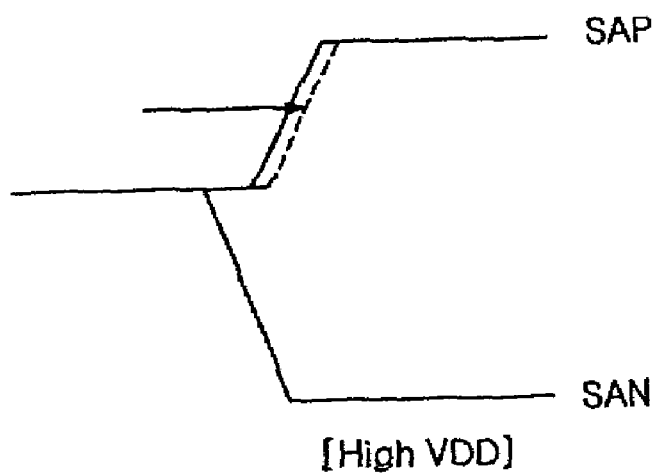

In addition to a normal VDD condition as shown in FIG. 8A, the enable timing of the SAP signal is sufficiently delayed more than the enable timing of the SAN signal at a high VDD condition as shown in FIG. 8B. Therefore, the level of the SB reaches the ground VSS level earlier than the RT0, and thus a data sensing operation is normally performed.

Figure 9:
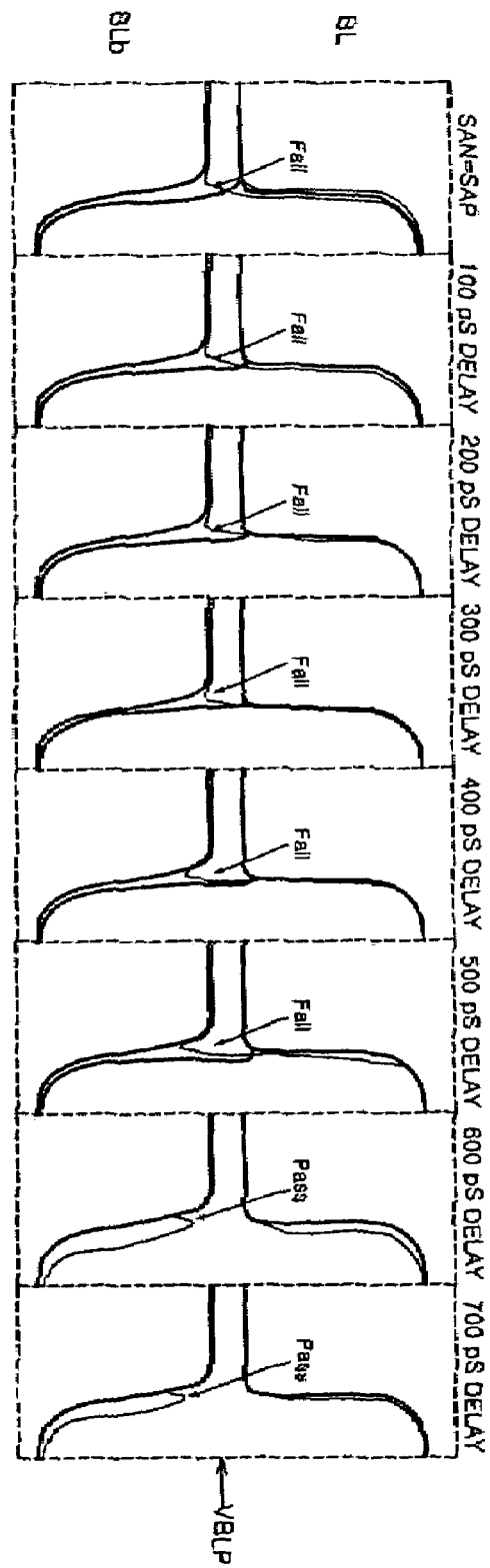
FIG. 9 is a waveform diagram illustrating simulation results of an operation of a sense amplifier according to an embodiment of the invention.

FIG. 9 illustrates simulation results of the operation of a sense amplifier. In an embodiment of the present invention, when the SAP is delayed for a predetermined time (for example, 600 pS) or more, a data sensing operation is normally performed. Accordingly, in an embodiment of the present invention, in FIGS. 8A and 8B, a circuit is designed such that the SAP is delayed for the delay time or more during which the data sensing operation is normally performed.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

The apparatus for sensing data of the semiconductor integrated circuit according to an embodiment of the present invention can prevent a data sensing error regardless of the power supply voltage level by using operation characteristics of the transistors. Therefore, the yield of semiconductor memory products and reliability of the operation thereof can be improved.

What is claimed is:

1. An apparatus for sensing data of a semiconductor integrated circuit, the apparatus comprising:
   a plurality of first driving signal driving units, each of which includes a first inverter having an output and a second inverter configured to receive the output of the first inverter, and is configured to generate a first driving signal by driving a first input signal;
   a plurality of second driving signal driving units, each of which is configured to generate a second driving signal by driving a second input signal and;
   a timing control unit configured to generate an output signal to control each of the first driving signal driving units such that a predetermined time difference is generated between an enable timing of the first driving signal and an enable timing of the second driving signal, wherein the output signal of the timing control unit is input to the first driving signal units, wherein the timing control unit comprises:
   a delay time adjusting unit configured to output a delay time adjusting signal according to a level of an external power supply; and
   an output delay unit configured to generate the output signal according to the delay time adjusting signal thereby providing the output signal to the first driving signal driving unit;
   a plurality of sense amplifier driving units, each of which is configured to generate a first driving level and a second driving level according to the first driving signal and the second driving signal; and
   a plurality of sense amplifiers, a respective sense amplifier provided for respective bit line pairs, each sense amplifier being configured to include first type switching elements operating according to the first driving level and second type switching elements operating according to the second driving level.

2. The apparatus of claim 1,
wherein the output delay unit comprises:
a dividing resistor configured to divide a power supply voltage; and
a switching element that controls an amount of power supply current that flows through the dividing resistor according to the delay time adjusting signal.

3. The apparatus of claim 2,
wherein the second inverter comprising a PMOS transistor and
wherein the dividing resistor includes:
a first resistor having a first end connected to a power supply terminal at a connection node and a second end; and
a second resistor having a first end commonly connected to the PMOS transistor and the second end of the first resistor.

4. The apparatus of claim 3,
wherein the PMOS transistor includes a bulk terminal and the connection node between the first end of the first resistor and the power supply terminal is connected to the bulk terminal of the PMOS transistor of the second inverter.

5. The apparatus of claim 3,
wherein the PMOS transistor includes a source and the first end of the second resistor is connected to the source of the PMOS transistor.

6. The apparatus of claim 3,
wherein the switching element comprises a transistor having a drain connected to the second end of the second resistor, a source connected to a ground terminal, and a gate configured to receive the delay time adjusting signal.

7. The apparatus of claim 1,
wherein the delay time adjusting unit includes a dividing resistor connected between a terminal for the external power supply and a ground terminal, and is configured to divide the external power supply so as to output the delay time adjusting signal.

8. The apparatus of claim 1, wherein the first driving level is a power supply level.

9. The apparatus of claim 1, wherein the first type switching elements comprise PMOS transistors.

10. The apparatus of claim 1, wherein the second driving level is a ground level.

11. The apparatus of claim 1, wherein the second type switching elements comprise NMOS transistors.

12. An apparatus for sensing data of a semiconductor integrated circuit, the apparatus comprising:
   a plurality of data sensing units, each of which includes sense amplifiers, each provided for each bit line pair having a bit line and a bit bar line and including a CMOS inverter having a NMOS transistor and a PMOS transistor, a first driving signal driving unit configured to generate a first driving signal for driving the PMOS transistors of the sense amplifiers, and a second driving signal driving unit configured to generate a second driving signal for driving the NMOS transistors of the sense amplifiers; and
   a timing control unit configured to generate an output signal to control the first driving signal driving unit such that the first driving signal of the data sensing unit is enabled later than the second driving signal thereof, wherein the output signal of the timing control unit is input to the first driving signal driving units, wherein the timing control unit comprises:
      a delay time adjusting unit configured to output a delay time adjusting signal according to a level of an external power supply; and
      an output delay unit configured to generate the output signal according to the delay time adjusting signal thereby providing the output signal to the first driving signal driving unit.

13. The apparatus of claim 12, wherein the plurality of data sensing units are connected in common to one timing control unit.

14. An apparatus for sensing data of a semiconductor integrated circuit, the apparatus comprising:
   a first driver configured to receive a first input signal and a timing control signal, to output a first driving signal;
   a second driver configured to receive a second input signal, to output a second driving signal;
   a timing control unit configured to generate the timing control signal so that the first driving signal is enable after the second driving signal is enabled, wherein the timing control unit comprises:
      a delay time adjusting unit configured to output a delay time adjusting signal according to a level of an external power supply; and
      an output delay unit configured to generate an output signal according to the delay time adjusting signal thereby providing the output signal to the first driving signal driving unit; and
   a sensing unit configured to sense a data in response to the first and the second driving signal.

* * * * *